United States Patent
Tsatsaragkos et al.

(10) Patent No.: US 8,930,790 B1
(45) Date of Patent: Jan. 6, 2015

(54) METHOD AND APPARATUS FOR IDENTIFYING SELECTED VALUES FROM AMONG A SET OF VALUES

(71) Applicant: Antcor S.A., Athens (GR)

(72) Inventors: Ioannis Tsatsaragkos, Patras (GR);
Nikolaos L. Kanistras, Patras (GR);
Vassilis Paliouras, Patras (GR)

(73) Assignee: u-blox AG (CH)

( * ) Notice: Subject to any disclaimer, the term of this patent is extended or adjusted under 35 U.S.C. 154(b) by 0 days.

(21) Appl. No.: 14/027,081

(22) Filed: Sep. 13, 2013

(51) Int. Cl.
*H03M 13/00* (2006.01)
*G06F 11/07* (2006.01)
*H03M 13/11* (2006.01)

(52) U.S. Cl.
CPC ....... *G06F 11/0751* (2013.01); *H03M 13/1102* (2013.01)
USPC ............................ 714/752; 714/755; 714/758

(58) Field of Classification Search
USPC .......................................... 714/752, 755, 758
See application file for complete search history.

(56) References Cited

U.S. PATENT DOCUMENTS

| | | | |
|---|---|---|---|
| 6,633,856 B2 | 10/2003 | Richardson et al. | |
| 7,137,060 B2 | 11/2006 | Yu et al. | |
| 7,139,959 B2 | 11/2006 | Hocevar | |
| 7,174,495 B2 | 2/2007 | Boutillon et al. | |
| 7,484,158 B2 | 1/2009 | Sharon et al. | |
| 7,836,383 B2 | 11/2010 | Efimov et al. | |
| 7,941,737 B2 | 5/2011 | Gopalakrishnan et al. | |
| 8,046,658 B2 | 10/2011 | Heinrich et al. | |
| 8,140,930 B1 * | 3/2012 | Maru | 714/752 |
| 8,201,049 B2 | 6/2012 | Lu | |
| 8,234,320 B1 * | 7/2012 | Yeo | 708/207 |
| 8,291,279 B2 | 10/2012 | Sharon et al. | |
| 8,429,512 B2 | 4/2013 | Sharon et al. | |
| 2009/0132887 A1 * | 5/2009 | Matsumoto et al. | 714/752 |
| 2013/0275827 A1 * | 10/2013 | Wang et al. | 714/752 |

OTHER PUBLICATIONS

Tsatsaragkos and V. Paliouras, "A Flexible Layered LDPC Decoder," in Proc. of 8th International Symposium on Wireless Communication Systems (ISWC), IEEE, pp. 36-40, 2011.

Chi-Long Wey, Ming-Der Shieh, Shin-Yo Lin, "Algorithms of finding the first two minimum values and their hardware implementation," IEEE Transactions on Circuits and Systems-I: Regular papers, vol. 55, No. 11, pp. 3430-3437, Dec. 2008.

M. Karkooti, P. Radosaljevic, and J. R. Cavallaro, "Configurable, high throughput, irregular LDPC decoder architecture: Tradeoff analysis and implementation," in Proc. ASAP, pp. 360-367, 2006.

J. Tang, T. Bhatt, V. Sundaranyrthy, and K. K. Parhi, "Reconfigurable shuffle network design in LDPC decoders," Proc. ASAP, pp. 81-86, 2006.

(Continued)

*Primary Examiner* — Sam Rizk
(74) *Attorney, Agent, or Firm* — Westberg Law Offices

(57) ABSTRACT

The present invention is directed toward identifying selected values from among a set of values. In accordance with an embodiment, a method of identifying two selected values from among a plurality of values comprises: partitioning the plurality of values into pairs of values; for each pair of values, using a comparator to select one of the two values to form a vector from the selected value of each pair; and applying the vector to a hardware unit that identifies first and second extreme values from among the values of the vector.

16 Claims, 11 Drawing Sheets

(56) References Cited

OTHER PUBLICATIONS

M. Karkooti and J. R. Cavallaro, "Semi-parallel reconfigurable architectures for real-time LDPC decoding," in Proc. Int. Conf. Inf. Technol.: Coding Comput., pp. 579-585, 2004.

F. R. Kschischang, B. J. Frey, H.-A. Loeliger, "Factor Graphs and the Sum-Product Algorithm," IEEE Transactions on Information Theory, (vol. 47, Issue: 2), pp. 498-519, Feb. 2001.

* cited by examiner

| # of inputs | # of step 304 applications | | | | |
|---|---|---|---|---|---|
| | 1 | 2 | 3 | 4 | |
| 4 | 40% | | | | |
| 8 | 31% | 46% | | | Comp |
| 16 | 28% | 41% | 48% | | |
| 32 | 26% | 39% | 46% | 49% | |

FIG. 11

| # of inputs | # of step 304 applications | | | | |
|---|---|---|---|---|---|
| | 1 | 2 | 3 | 4 | |
| 4 | 50% | | | | |
| 8 | 40% | 60% | | | Mux |
| 16 | 36% | 55% | 64% | | |
| 32 | 35% | 52% | 61% | 65% | |

FIG. 12

METHOD AND APPARATUS FOR IDENTIFYING SELECTED VALUES FROM AMONG A SET OF VALUES

BACKGROUND OF THE INVENTION

The present invention relates to the field of message passing algorithms for performing inference on graphical models. Such message passing algorithms are employed in the field of error correction coding and decoding. Thus, the present invention relates also to the field of error correction coding and decoding and, more particularly, to Low Density Parity Check (LDPC) codes and to an LDPC decoder.

The process of transmitting digital data can introduce errors into the data. As a result, the received data can be different from the transmitted data. Such errors are typically caused by noise that is present in the transmission channel. The amount of errors is generally related to the transmission signal strength in relation to the amount of noise present. Error correction coding is a technique by which redundancy is inserted into the data prior to transmission. Upon reception, this redundancy is used in an attempt to correct errors that were introduced during the transmission process.

Block coding is a type of error correction coding in which the digital data to be transmitted is broken into messages of fixed size. Prior to transmission, each message is encoded into a codeword (also referred to as a "block") by an encoder. Redundancy is inserted during the encoding process so that the codewords are made larger than the messages. Assume that the codewords each consist of n bits. Only certain patterns of n bits are codewords; the remaining patterns are invalid. The codewords are then transmitted, which may cause the codewords to become corrupted. Upon reception, a decoder attempts to infer the original messages from the received, and possibly corrupted, codewords.

A linear block error correction code is one in which any linear combination of codewords is also a codeword. A generator matrix can be used during the encoding process to encode the messages into valid codewords. Upon reception, a parity check matrix can be used during the decoding process to generate an error vector, where the error vector indicates the presence of errors in the received codeword. The parity check matrix is related to the generator matrix in that it can be derived from the generator matrix.

Low Density Parity Check (LDPC) codes are a subcategory of linear block error correction codes characterized by a sparse parity check matrix. This means that the parity check matrix consists mainly of 0's and a relatively small number of 1's.

LDPC codes were first introduced in the 1960's but have more recently received increased attention. This is due at least in part to inherent parallelism in decoding which makes LDPC codes suitable for hardware implementation and due to flexibility in designing LDPC codes, which allows LDPC codes to be used in a variety of applications.

An LDPC code is a linear error-correction code, fully defined by a sparse binary parity check matrix H. A bipartite Tanner graph is a widely used way to represent a parity check matrix H. This graph consists of two sets of nodes, namely the check nodes and the variable nodes. Each row of H corresponds to a parity check equation, graphically represented as a check node of the Tanner graph, while columns correspond to the codeword bits, graphically represented as variable nodes. An ace in the H matrix indicates a connection between the corresponding variable and check nodes. Message passing algorithms for decoding LDPC codes operate by iteratively passing information along the edges of the Tanner graph. In a sense, the variable nodes correspond to bits of a received word, both message and parity, while check nodes correspond to parity check equations.

Decoding of LDPC codes can be based on sum-product message passing, which is also referred to as a belief propagation. In this case, the Tanner graph for a particular LDPC code can be used as a guide for constructing a hardware decoder for the code by replacing the nodes of the Tanner graph with computing elements and by replacing the edges between the nodes with communication buses that connect the computing elements. Probabilistic information, in the form of log-likelihood ratios (LLRs), can be passed along the communication buses between the computing elements.

While sum-product message passing (or belief propagation) is considered to be near-optimal for LDPC codes, practical LDPC decoders must take into account considerations such as decoder size and latency. This is particularly the case for LDPC codes whose codeword lengths can be, for example, 648, 1296, or 1944 bits, or longer. Thus, in an effort to reduce complexity, hardware decoders commonly use an approximation of the sum-product algorithm, such as the min-sum algorithm and its variations (e.g. normalized min-sum, offset min-sum, corrected min-sum, etc).

An operation that is typically performed within the node processors of an error correction decoder that employs message passing based on the min-sum algorithm and its variations involves identifying the two minimum values from a greater number of inputs. Existing methods of identifying the two minimum values tend to require circuitry having complexity that is relatively high, in terms of hardware, latency, and power dissipation.

SUMMARY OF THE INVENTION

The present invention is directed toward identifying selected values from among a set of values. In accordance with an embodiment, a method of identifying two selected values from among a plurality of values comprises: partitioning the plurality of values into pairs of values; for each pair of values, using a comparator to select one of the two values to form a vector from the selected value of each pair; and applying the vector to a hardware unit that identifies first and second extreme values from among the values of the vector.

In accordance with a further embodiment, an apparatus for identifying two selected values from among a plurality of values comprises a plurality of comparison circuits, each comparison circuit being configured to receive a pair of values partitioned from the plurality of values and to select one of each pair of values as an output. The apparatus further comprises selection circuitry configured to receive the selected values output from the plurality of comparison circuits and to identify a first minimum value, the first minimum value being selected from among all of the values of the plurality and a second minimum value, the second minimum value being selected from among a subset of the values of the plurality and wherein the selection circuitry is configured to output the first minimum value and the second minimum value.

BRIEF DESCRIPTION OF THE DRAWINGS

The present invention is described with respect to particular exemplary embodiments thereof and reference is accordingly made to the drawings in which:

FIG. 11 illustrates a summary of complexity reduction, in terms of the number of comparators required in accordance with an embodiment of the present invention;

FIG. 12 illustrates a summary of complexity reduction, in terms of the number of multiplexer required in accordance with an embodiment of the present invention;

DETAILED DESCRIPTION OF A PREFERRED EMBODIMENT OF THE INVENTION

Error correction decoders and specifically LDPC decoders that utilize message passing based on the min-sum algorithm and its variations (e.g. normalized min-sum, offset min-sum, corrected min-sum, etc.) contain circuitry that identifies the two minimum values from a set of intermediate results. The present invention is directed toward a method and apparatus for identifying selected values from among a set of values. The selected values are not necessarily the two minimum values, though embodiments of the invention identify values that approximate the two minimum values. More particularly, an embodiment of the invention identifies a first value that is the minimum value among the set of values and a second value that approximates the second minimum value among the set of values. The second value can be a minimum value among a subset of the values.

While the results are not necessarily numerically identical to the two minimum values among the set of values, embodiments of the present invention can be employed in in a variety circumstances without appreciable drawbacks. For example, simulations suggest that use of this technique in LDPC decoders that employ the min-sum algorithm and its variations achieve a satisfactory coding gain. A significant benefit to this approach is that the complexity of the processor that implements the techniques disclosed herein is greatly reduced. For example, embodiments of the present invention can be employed in a check node processor within a LDPC decoder that handles several input messages in parallel.

This simplification can be achieved by approximating the problem of finding the first and second minimum of the input messages by a different problem of finding the minimum of the complete set of the input messages and also finding a second message that is the minimum among a subset of the input messages. This relaxation of requirements and accompanying reduction in the complexity of the problem addressed leads to hardware simplification at the cost of an acceptably small degradation in corrective capability.

Embodiments of the present invention approximate the problem of finding the two minima in a set of input messages by a simpler problem, the solution of which requires substantially fewer comparisons. Such circuitry can be employed, for example, in check node processors in an LDPC decoder. Therefore by trading minor losses in coding gain, substantial simplification in hardware complexity of the implementation of the check node processors within an LDPC decoder is achieved.

Figure 1:
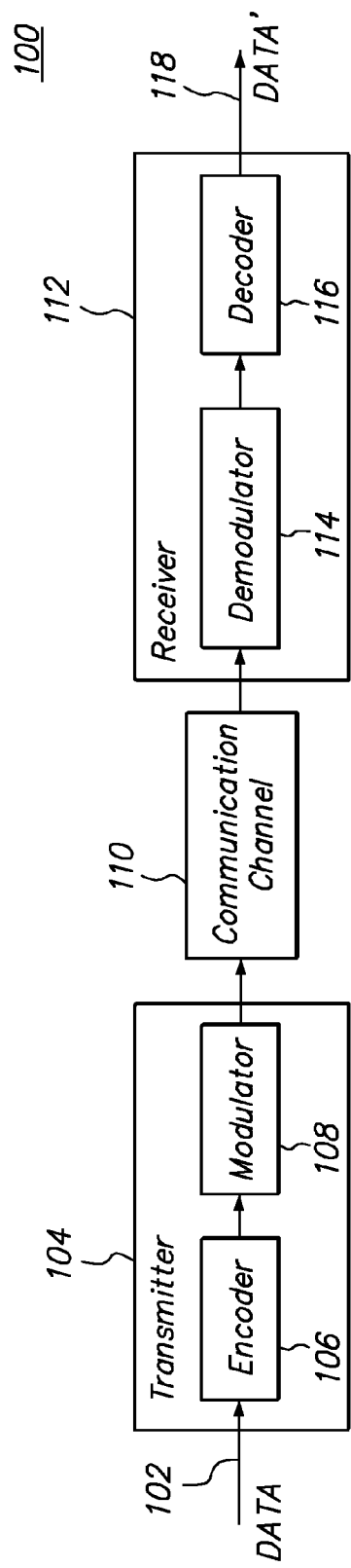
FIG. 1 illustrates a communication system in which embodiments of the present invention can be implemented.

FIG. 1 illustrates a communication system 100 in which embodiments of the present invention can be implemented. As shown in FIG. 1, digital data 102 to be transmitted is input to a transmitter 104. The transmitter 104 can include an encoder 106 and a modulator 108. The encoder 106 performs error correction coding on the data, for example, by breaking the data 102 into messages of fixed size and encoding the messages into codewords. Redundancy can be inserted during the encoding process so that the codewords are made larger than the messages.

The modulator 108 can then prepare the codewords for transmission by modulating one or more carrier signals in accordance with the codewords. As an example, the modulation can be performed in accordance with orthogonal frequency division multiplexing (OFDM). Each modulated and encoded signal can then be transmitted via a communication channel 110. The channel 110 can be, for example, a wireless communication channel which can be, for example, part of a wireless local area network (WLAN).

A receiver 112 receives the transmitted signal from the channel 110. The receiver 112 can include a demodulator 114 and a decoder 116. The demodulator 114 demodulates the received signal as to reconstruct the codewords. The codewords can then be decoded by the decoder 116 in order to reconstruct the original data 102. While the decoder 116 can correct certain errors introduced by the communication process, the data 118 output from the decoder 112 can differ from the original data 102 due to uncorrected errors that remain.

Figure 2:
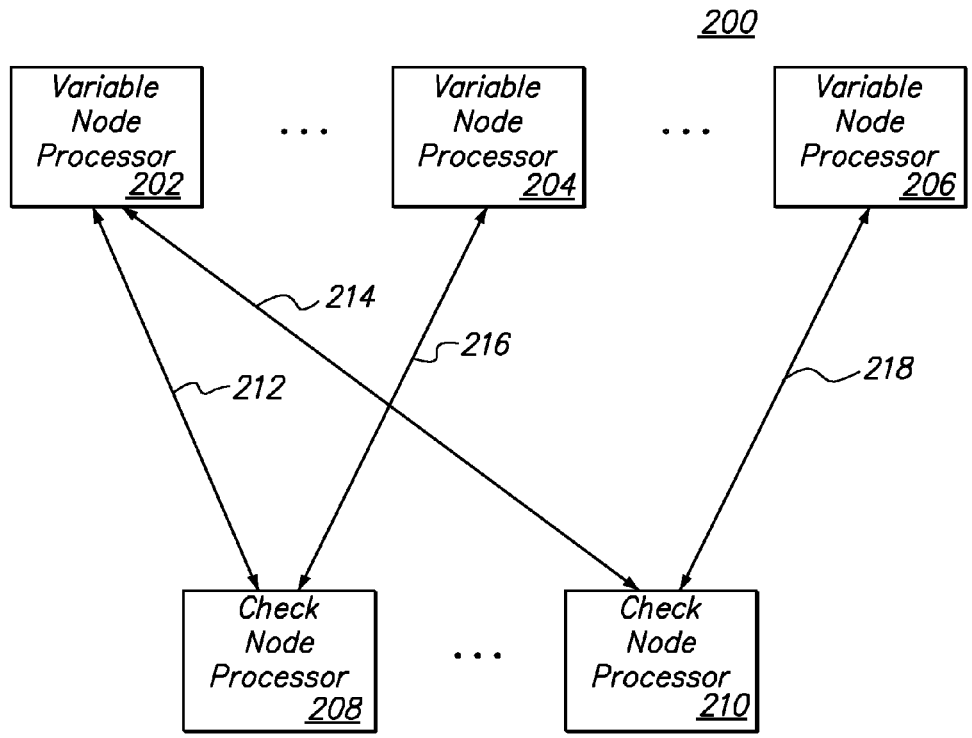
FIG. 2 illustrates an error correction decoder in accordance with an embodiment of the present invention.

FIG. 2 illustrates an error correction decoder 200 in accordance with an embodiment of the present invention. The error correction decoder 200 shown in FIG. 2 can be included in the error correction decoder 116 of FIG. 1. As shown in FIG. 2 the decoder 200 includes a plurality of variable node processors 202, 204, 206, and a plurality of check node processors 208, 210. Communication buses 212, 214, 216, 218 provide a means for passing messages between the variable node processors 202, 204, 206, and the check node processors 208, 210.

For purposes of illustration, the decoder 200 of FIG. 2 is shown with three variable node processors and two check node processors, however, it will be apparent the number of variable and check nodes is generally related to the parity check matrix dimensions of a particular error correction code.

For example, codeword lengths for LDPC codes can be, for example, 648, 1296, or 1944 bits, or longer. The number and locations of the communication buses of the decoder 200 will generally be related to the locations of 1's in the parity check matrix for a particular error correction code. Thus, the number of each of the variable node processors and check nodes processors, as well as the placement of communication buses between them can be derived from the Tanner graph and/or from the parity check matrix for a specific error correction code.

Each of the variable node processors and check node processors includes hardware circuitry, which can include memory, registers, logic circuitry, general-purpose and/or specialized processors, machine-readable software, application specific integrated circuits (ASICs), programmable logic arrays (PLAs), and so forth. It will be apparent that the particular arrangement of the decoder 200 is exemplary and that embodiments of the present invention can be employed in conjunction with other decoder arrangements and architectures.

Sum-product message passing can be performed by the decoder 200. In this case, probabilistic information, e.g. in the form of log-likelihood ratios (LLRs), can be passed along the communication buses 212, 214, 216, 218 between the variable node processors 202, 204, 206 and the check node processors 208, 210. The decoder 200 can be initialized with LLRs that pertain to bits of each codeword received from the communication channel 110. For each half-iteration, the variable node processors 202, 204, 206 take inputs from the check node processors 208, 210 and compute outputs for the check node processors 208, 210. For the next half-iteration, the check node processors 208, 210 take inputs from the variable node processors 202, 204, 206 and compute outputs for the variable node processors 202, 204, 206. These iterations can be repeated until a codeword is found or some other stopping criterion is reached.

Figure 3:
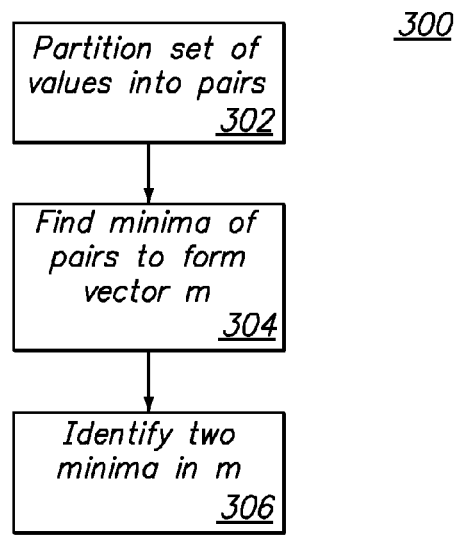
FIG. 3 illustrates a method of identifying two selected values from among a plurality of values in accordance with an embodiment of the present invention.

FIG. 3 illustrates a method 300 of identifying two selected values from among a plurality of values in accordance with an embodiment of the present invention. The method 300 can be performed by the decoder 200 of FIG. 2. More particularly, the method 300 can be performed by each of the check node processors 208, 210 of FIG. 2. A set of values to be processed in accordance with the method of 300 can include the probabilistic values obtained from the variable node processors 202, 204, 206 of FIG. 2.

In a step 302, the set of values is partitioned into pairs. For example, assume the set of input values is D where D=[1, 3, 4, 6, 3, 6, 2, 1]. In the step 302, D can be partitioned into pairs as P=[{1, 3}, {4, 6}, {3, 6}, {2, 1}]. In an embodiment, there is no constraint on how the initial partitioning can be done. In other words, the values can be partitioned into any pairs. If the set has an odd number of values, a value can be added to the set so that the entire set can be partitioned into pairs. For example, the added value can be equal to or greater than a value already in the set with which the added value is paired.

In a step 304, the minimum value for each pair of values is identified and a vector of the minimum values is formed. This step can be performed, for example, using one or more comparators. Returning to the example, a result of applying the step 304 to the set P=[{1, 3}, {4, 6}, {3, 6}, {2, 1}] is a vector m=[1, 4, 3, 1]. The vector m contains the minima of the pairs of P. A second vector M can be produced in step 304 which contains the maxima of P. In the example, M=[3, 6, 6, 2]. In an embodiment, M is disregarded or not produced. In other embodiments the vector M may be further processed.

In a step 306, the two minima in m are identified. In the example: the two minima are 1 and 1.

Other variants of the second step can be implemented. For example instead of finding the two minima of m, the procedure described in the first step can be applied iteratively. In this case, referring to the example, m can be further partitioned as [{1, 4}, {3, 1}] and then the method returns [1, 1].

Figure 4:
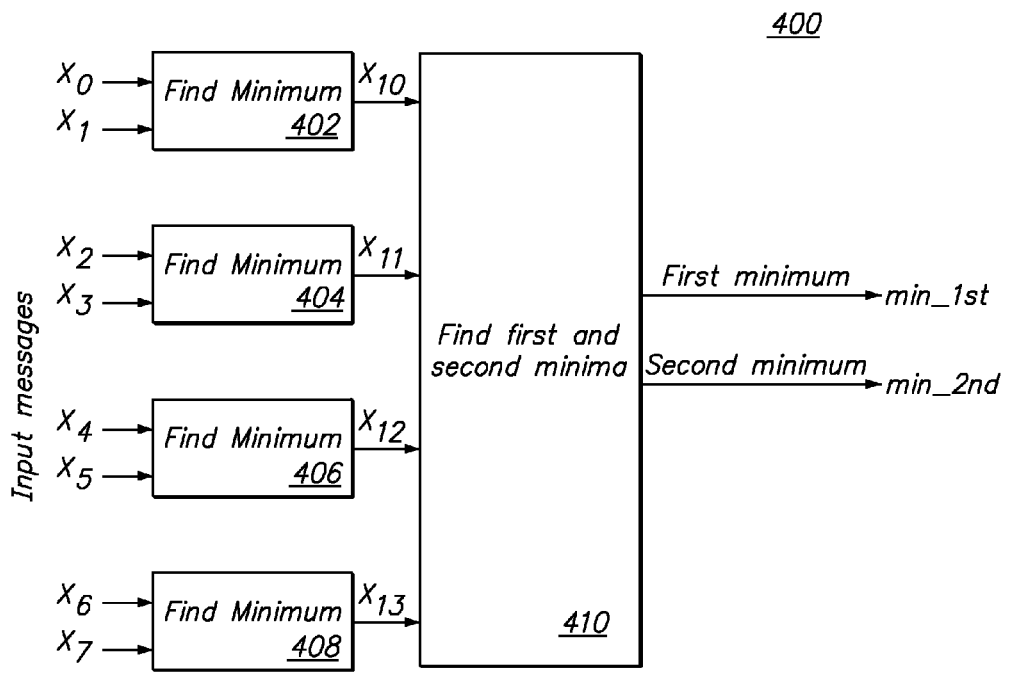
FIG. 4 illustrates an apparatus for identifying two selected values from among a plurality of values in accordance with an embodiment of the present invention.

FIG. 4 illustrates an apparatus 400 for identifying two selected values from among a plurality of values in accordance with an embodiment of the present invention. The apparatus 400 can be used to perform the method 300 of FIG. 3. As shown in FIG. 4, a plurality of input messages (or values) is applied to inputs $x_0$, $x_1$, $x_2$, $x_3$, $x_4$, $x_5$, $x_6$, $x_7$. The values in D can be applied to these inputs. The apparatus 400 includes a plurality of comparator blocks 402, 404, 406, 408, one for each pair of the inputs $x_0$, $x_1$, $x_2$, $x_3$, $x_4$, $x_5$, $x_6$, $x_7$. Applying the pairs of the values in D to the inputs of the comparator blocks 402, 404, 406, 408, partitions the values into pairs, as in the vector P. This corresponds to the step 302 in FIG. 3.

Each of the comparator blocks 402, 404, 406, 408 compares the pair of values at its inputs to identify the minimum value of the pair. Specifically, block 402 compares inputs $x_0$, $x_1$ to identify the minimum of the two. The minimum value output $x_{10}$ of block 402 is applied as an input to a minima computation block 410. Similarly, the block 404 compares inputs $x_2$, $x_3$ to identify the minimum of the two and the output $x_{11}$ is applied as an input to the block 410. The block 406 compares inputs $x_4$, $x_5$ to identify the minimum of the two and the output $x_{12}$ is applied as an input to the block 410. The block 408 compares inputs $x_6$, $x_7$ to identify the minimum of the two and the output $x_{13}$ is applied as an input to the block 410. The values input to the block 410 correspond to the vector m. Operation of the comparator blocks 402, 404, 406, 408 and forming of the vector m corresponds to the step 304 of FIG. 3.

Figure 5:
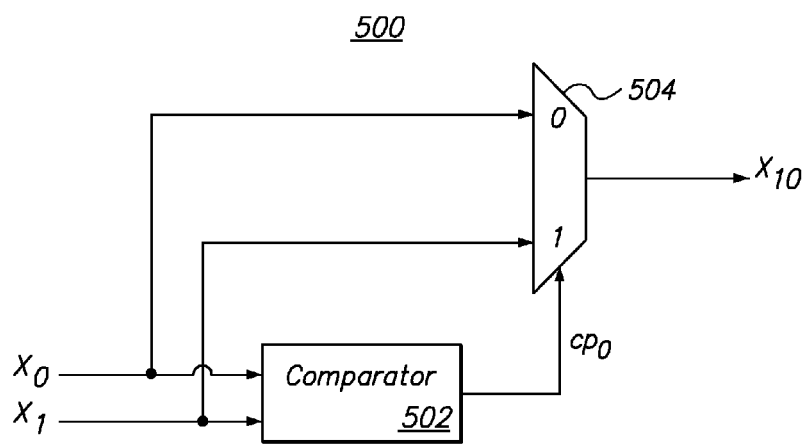
FIG. 5 illustrates an apparatus for comparing two values and identifying the lowest one of the two in accordance with an embodiment of the present invention.

FIG. 5 illustrates a comparator apparatus 500 for comparing two values and identifying the lowest one of the two in accordance with an embodiment of the present invention. As shown in FIG. 5, inputs $x_0$, $x_1$ are applied to a comparator 502 and to a multiplexer 504. The output $cp_0$ of the comparator 502 is a binary value that is dependent upon which of the two values $x_0$, $x_1$ is lower. The output $cp_0$ controls the multiplexer 504 so that the lower of the two values is passed to the output $x_{10}$ of the comparator apparatus. The apparatus 500 can be included in each of the comparator blocks 402, 404, 406, 408 of FIG. 4.

Returning to FIG. 4, the minima computation block 410 receives as its inputs the vector m at inputs $x_{10}$, $x_{11}$, $x_{12}$, $x_{13}$. The minima computation block 410 then identifies the first and second minima from among the values in m and outputs these values as min_1st and min_2nd. This corresponds to the step 306 shown in FIG. 3.

Figure 6:
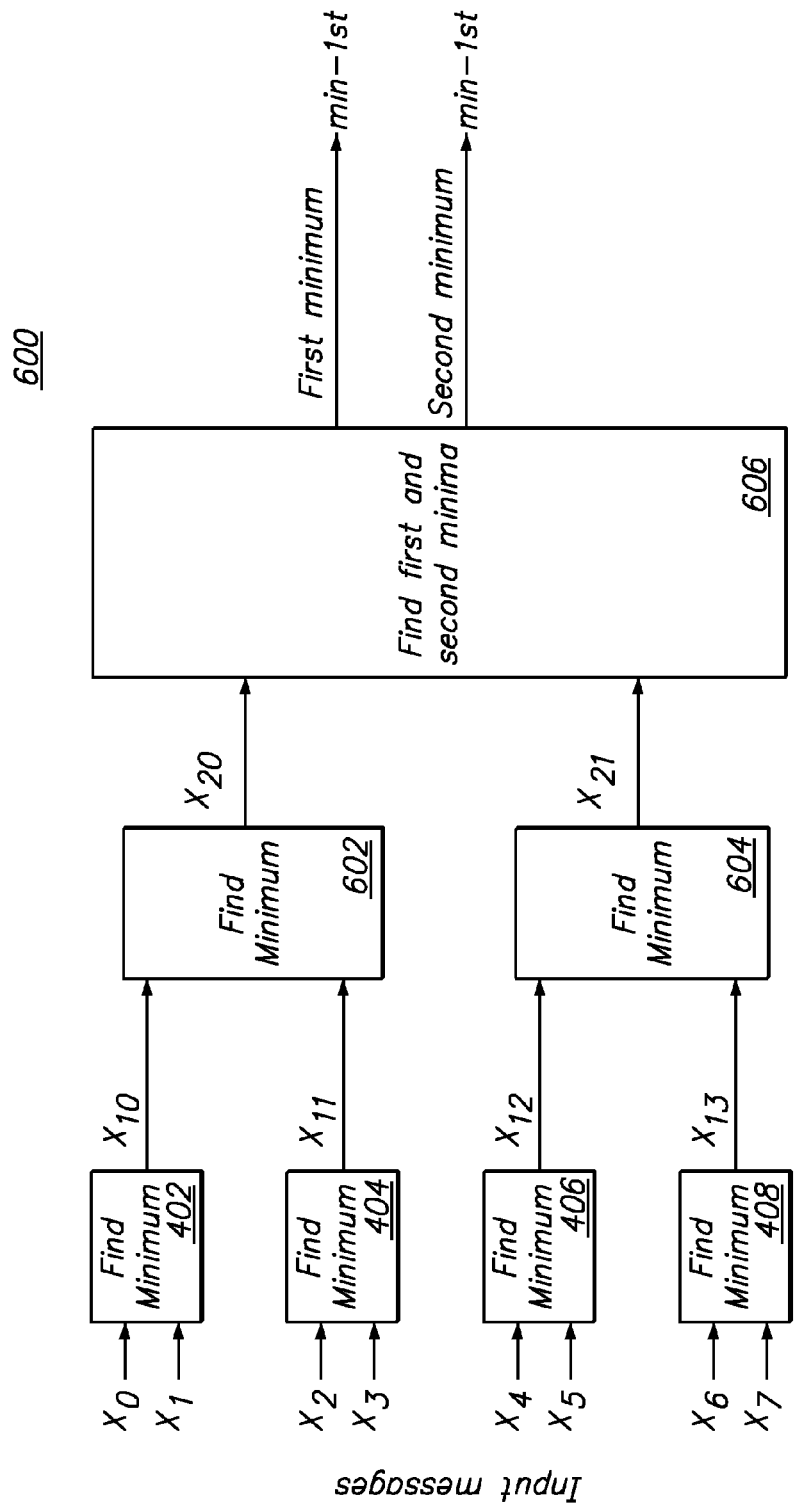
FIG. 6 illustrates an apparatus for iteratively identifying two selected values from among a plurality of values in accordance with an embodiment of the present invention.

FIG. 6 illustrates an apparatus 600 for iteratively identifying two selected values from among a plurality of values in accordance with an embodiment of the present invention. FIG. 6 can be used to perform the aforementioned variant of the method 300 in which steps 304 (and possibly also 306) is applied iteratively. More particularly, as shown in FIG. 6, a plurality of input messages (or values) is applied to inputs $x_0$, $x_1$, $x_2$, $x_3$, $x_4$, $x_5$, $x_6$, $x_7$. The apparatus 600 includes a plurality of comparator blocks 402, 404, 406, 408, one for each pair of the inputs $x_0$, $x_1$, $x_2$, $x_3$, $x_4$, $x_5$, $x_6$, $x_7$. These blocks can be identical to the blocks that have the same reference numerals in FIG. 4. Each of the comparator blocks 402, 404, 406, 408, compares the pair of values at its inputs to identify the minimum value of the pair.

A next stage of comparator blocks 602, 604 receives the values identified by the first stage and, again, each compares the pair of values at its inputs to identify the minimum value of the pair. Any number of such stages can be added so that the values are winnowed down to a single pair. This single pair $x_{20}$, $x_{21}$ is applied to a "find first and second minima" block 606. This block 606 identifies which one is the minimum and which one is the second minimum.

Figure 7:
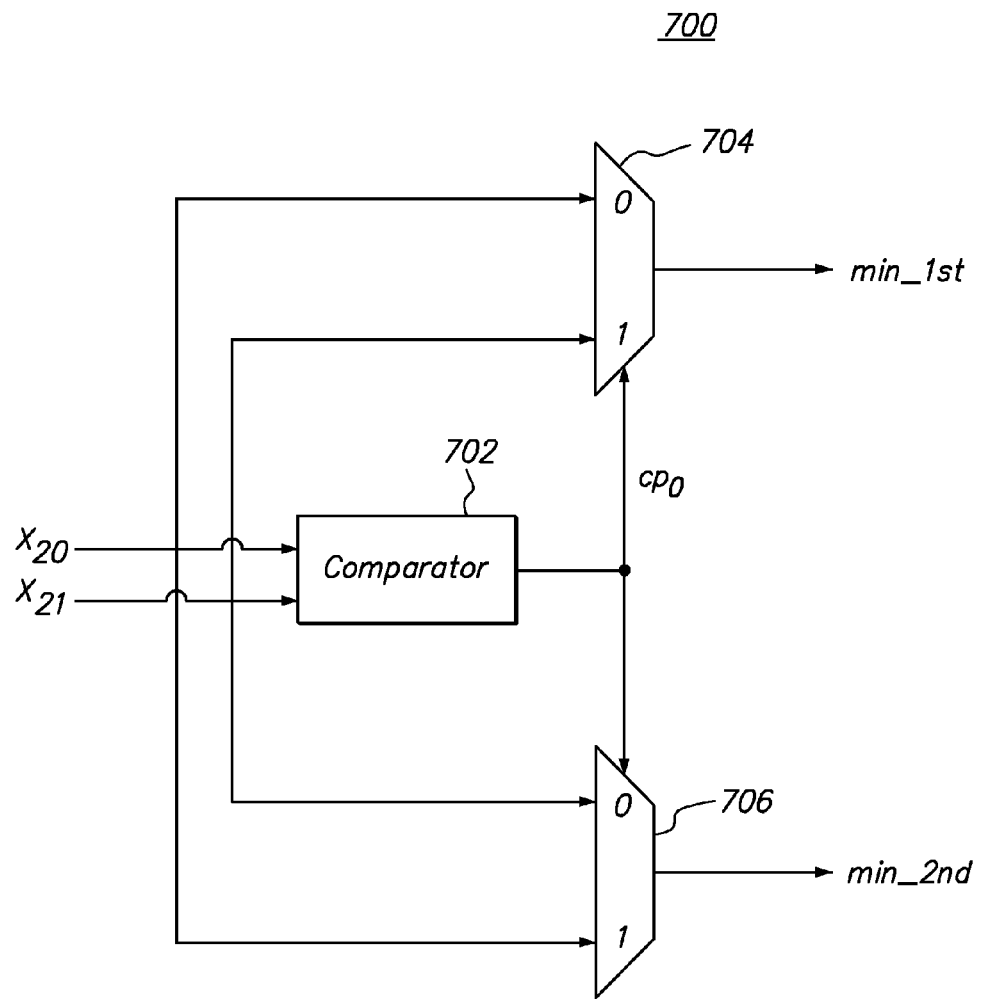
FIG. 7 illustrates an apparatus for comparing two values and identifying which one is the minimum and which one is the second minimum in accordance with an embodiment of the present invention.

FIG. 7 illustrates a comparator apparatus 700 for comparing two values and identifying which one is the minimum and which one is the second minimum in accordance with an embodiment of the present invention. As shown in FIG. 7, inputs $x_{20}$, $x_{21}$ are applied to a comparator 702 and to two multiplexers 704, 706. The output $cp_0$ of the comparator 702 is a binary value that is dependent upon which of the two values $x_{20}$, $x_{21}$ is lower. The output $cp_0$ controls the multiplexers 704 and 706, so that the lower of the two values is passed to the output min_1st and the higher value is passed to the output min_2nd of the comparator apparatus 700. The apparatus 700 can be included in the find "first and second minima" block 606 of FIG. 6.

Figure 8:
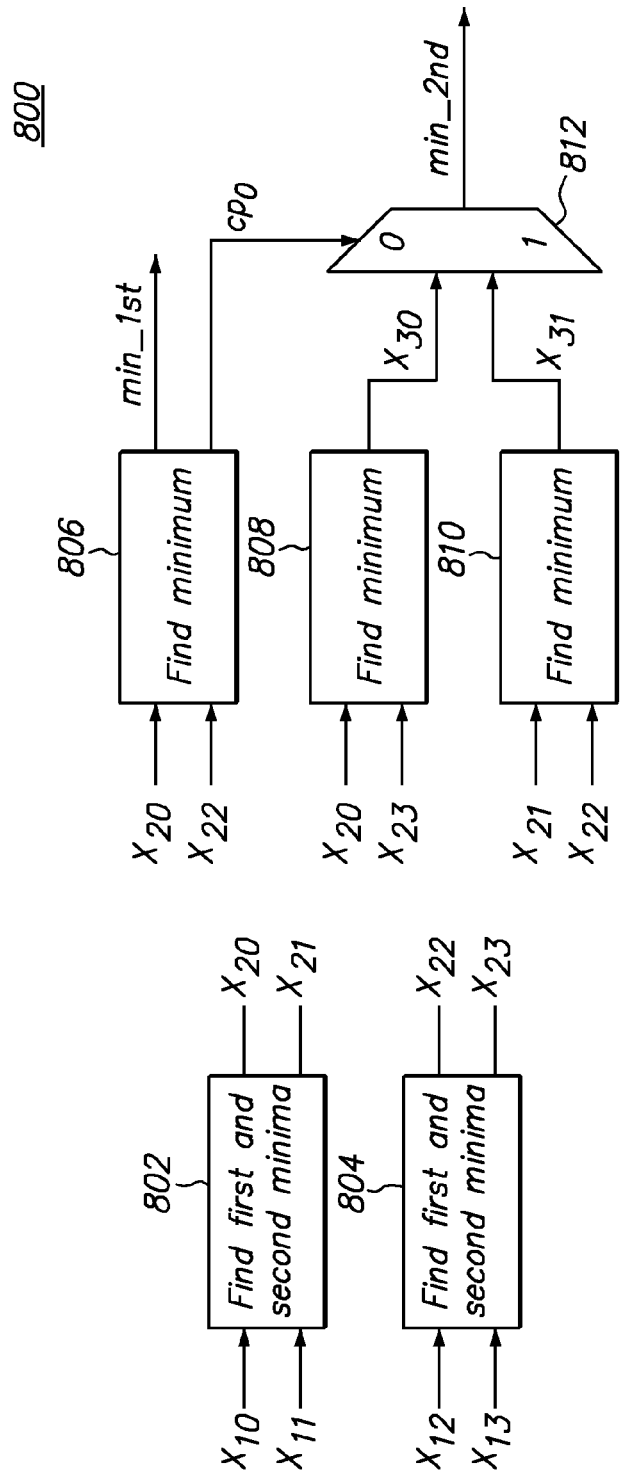
FIG. 8 illustrates an apparatus for identifying the lowest two values from among a plurality of values in accordance with an embodiment of the present invention.

FIG. 8 illustrates an apparatus 800 for identifying the lowest two values from among a plurality of values in accordance with an embodiment of the present invention. The apparatus 800 can be included in the minima computation block 410. Referring to FIG. 8, outputs $x_{10}$, $x_{11}$ are applied to a "find first and second minima" block 802, as described in FIG. 7. The lower of the two values is passed to the output $x_{20}$ of the comparator apparatus 802 and the higher value to the output $x_{21}$. Similarly, outputs $x_{12}$, $x_{13}$ are applied to a "find first and second minima" block 804. The lower of the two values is passed to the output $x_{22}$ of the comparator apparatus and the higher value to the output $x_{23}$. Outputs $x_{20}$, $x_{22}$ are applied to a comparator block 806. The output min_1st of the comparator block 806 corresponds to the minimum value from among the values of the vector m (and from among the original set of values D).

Outputs $x_{20}$, $x_{23}$ are applied to a comparator block 808. The output $x_{30}$ corresponds to the lower of the two values $x_{20}$, $x_{23}$. Outputs $x_{21}$, $x_{22}$ are applied to a comparator block 810. The output $x_{31}$ corresponds to the lower of the two values $x_{21}$, $x_{22}$. The output $cp_0$ of the comparator block 806 controls the multiplexer 812 so as to route the lower of the two values $x_{30}$, $x_{31}$ to the output, min_2nd. This obtains the next minimum value min_2nd. The value min_2nd value is the minimum value among the values of the vector m. The min_2nd value is not necessarily the second lowest value from among the original set of values D, but is instead an approximation of the second lowest value from among the original set of values D.

While the example set D includes eight values for purposes of explanation, in practice, the set D can have a different number of values. For example, set D can be significantly larger. In this case, appropriate modifications can be made to the apparatus shown in FIGS. 2 and 4-8. It will be apparent that the apparatus illustrated in FIGS. 2 and 4-8 is exemplary and that advantages of the present invention can be achieved with modifications of the apparatus or with different apparatus. It will be apparent also that rather than identifying the minimum values, embodiments of the present invention can be utilized to more generally to identify extreme values, e.g., maximum values. This can be accomplished, for example, by reversing the inputs to multiplexers disclosed herein or by inverting control inputs to multiplexers disclosed herein.

Figure 9:
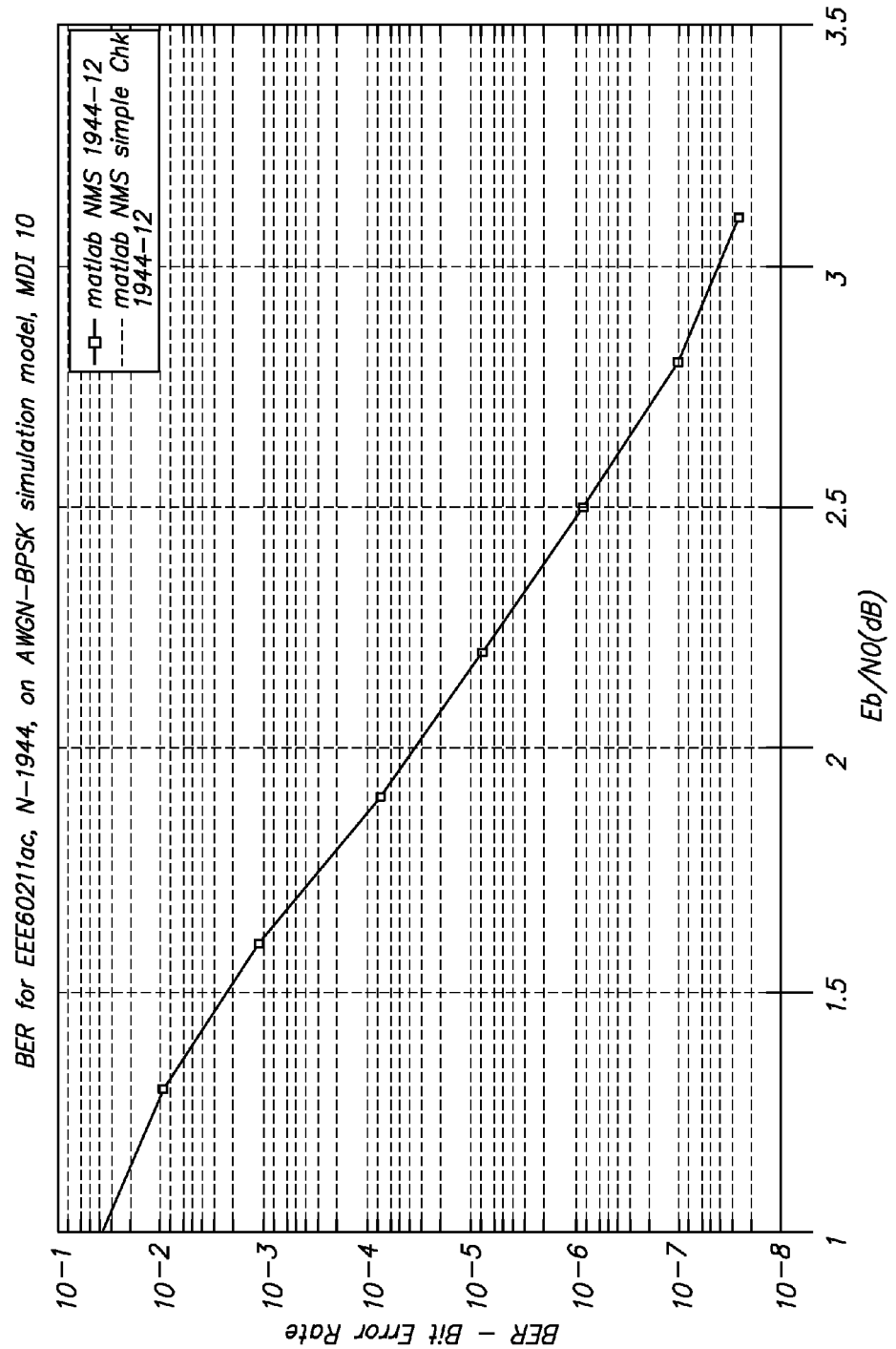
FIG. 9 illustrates simulation results showing only modest performance degradation in accordance with an embodiment of the present invention.
Figure 10:
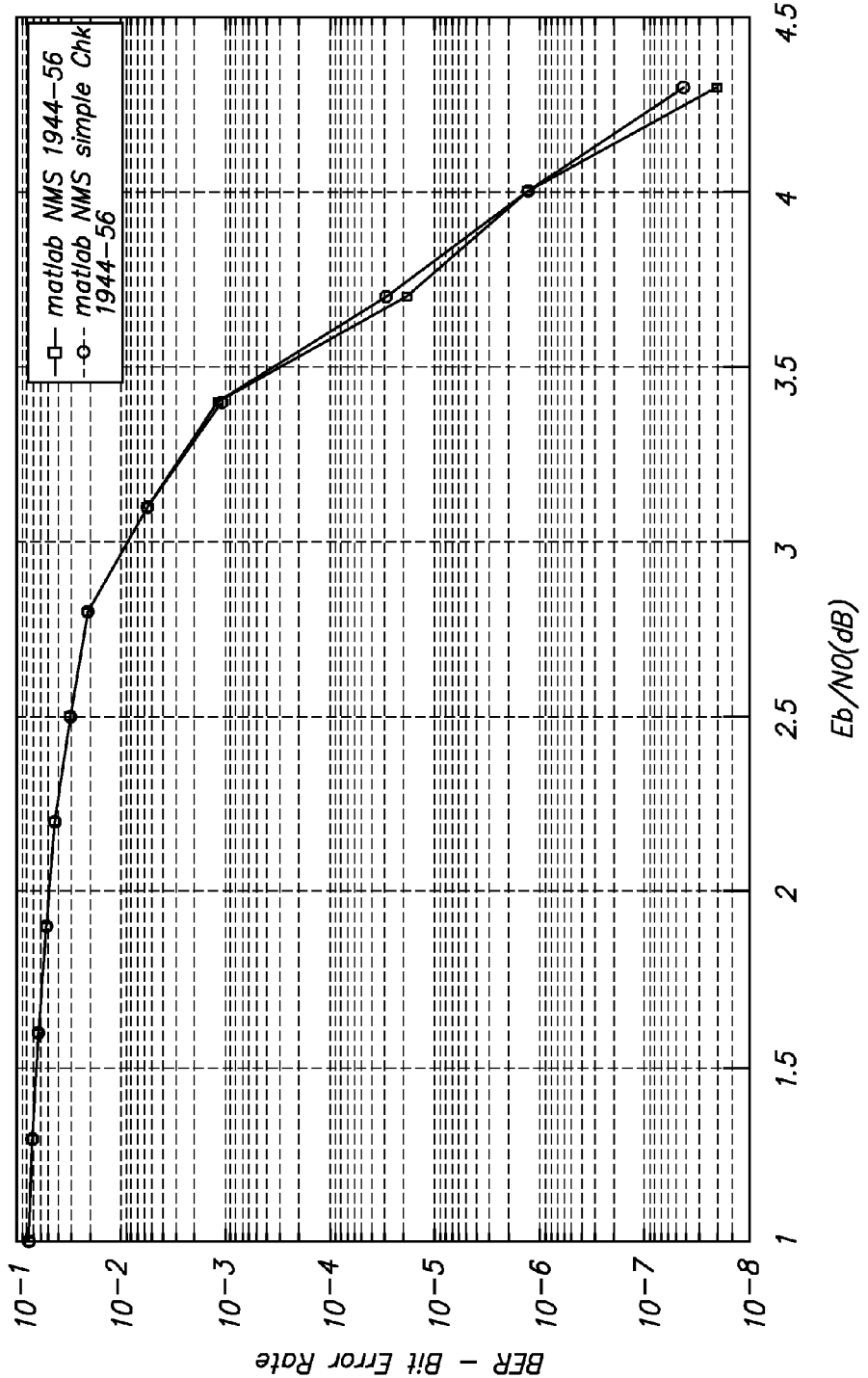
FIG. 10 illustrates simulation results showing only modest performance degradation in accordance with an embodiment of the present invention.

While the results obtained by the proposed method are not necessarily numerically identical to the solution of the original problem, simulations suggest that this approach can be used in LDPC decoding methods that utilize min-sum and variations thereof while achieving a satisfactory coding gain. Embodiments of the present invention allow for substantial complexity reduction at the cost of almost negligible degradation at the correction capability of the decoder (approx. 0.02 dB for a IEEE 802.11 ac code, rate ½). As an example, simulation results of a bit error rate (BER) plot shown in FIG. 9 for the code-rate-½, 1944-bit code of the IEEE 802.11ac standard, reveal a performance degradation of 0.015 dB in code gain. As another example, FIG. 10 shows a simulated BER plot for the code-rate-⅚, 1944-bit code of the IEEE 802.11ac standard. This shows a performance degradation that is insignificant, within the limits of statistical error. The benefit is that far less message comparisons are required in the check node processors and therefore the complexity of the check node processors is substantially reduced.

The complexity reduction has been found to be proportional to the number of applications of the step 304. FIGS. 11 and 12 summarize the complexity reduction, in terms of the number of comparators and multiplexers required respectively, as a function of the number of step 304 applications and the number of input values.

Figure 13:
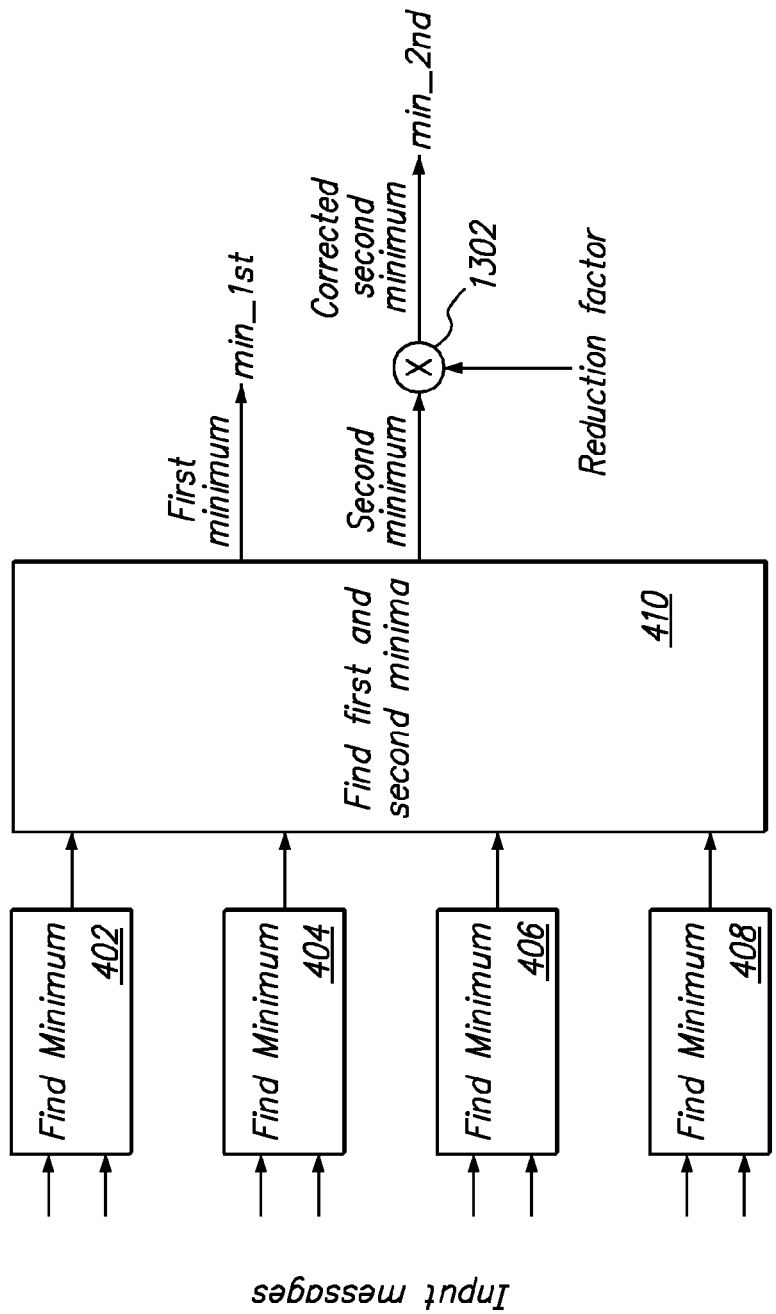
FIG. 13 illustrates an apparatus for identifying two selected values from among a plurality of values, where the min_2nd value is multiplied by a reduction factor, in accordance with an embodiment of the present invention.

On the other hand, as the step 304 of the method 300 is applied iteratively more than once the possibility of error, i.e. the calculated min_2nd value not to be the second lowest value of the original set of values D, is increased. The approximated second minimum value is always greater than or equal to the actual second minimum value. In an embodiment of the invention, the min_2nd value is multiplied by a positive correction factor of value less than one, as shown in FIG. 13. Simulations show that the application of this reduction factor on the min_2nd value may reduce the correction capability degradation.

A possible way to compute the reduction factor is to compute the average value of the ratio of the actual second minimum over the estimated second minimum for a large number of values, obtained during simulation of an LDPC decoder.

The result of the min_2nd value multiplication by the reduction factor may be a value lower than the minimum value. In order to prevent this, in another embodiment, shown in FIG. 14, some additional circuitry ensures that the resulting second minimum value is always greater than the first minimum value.

Figure 14:
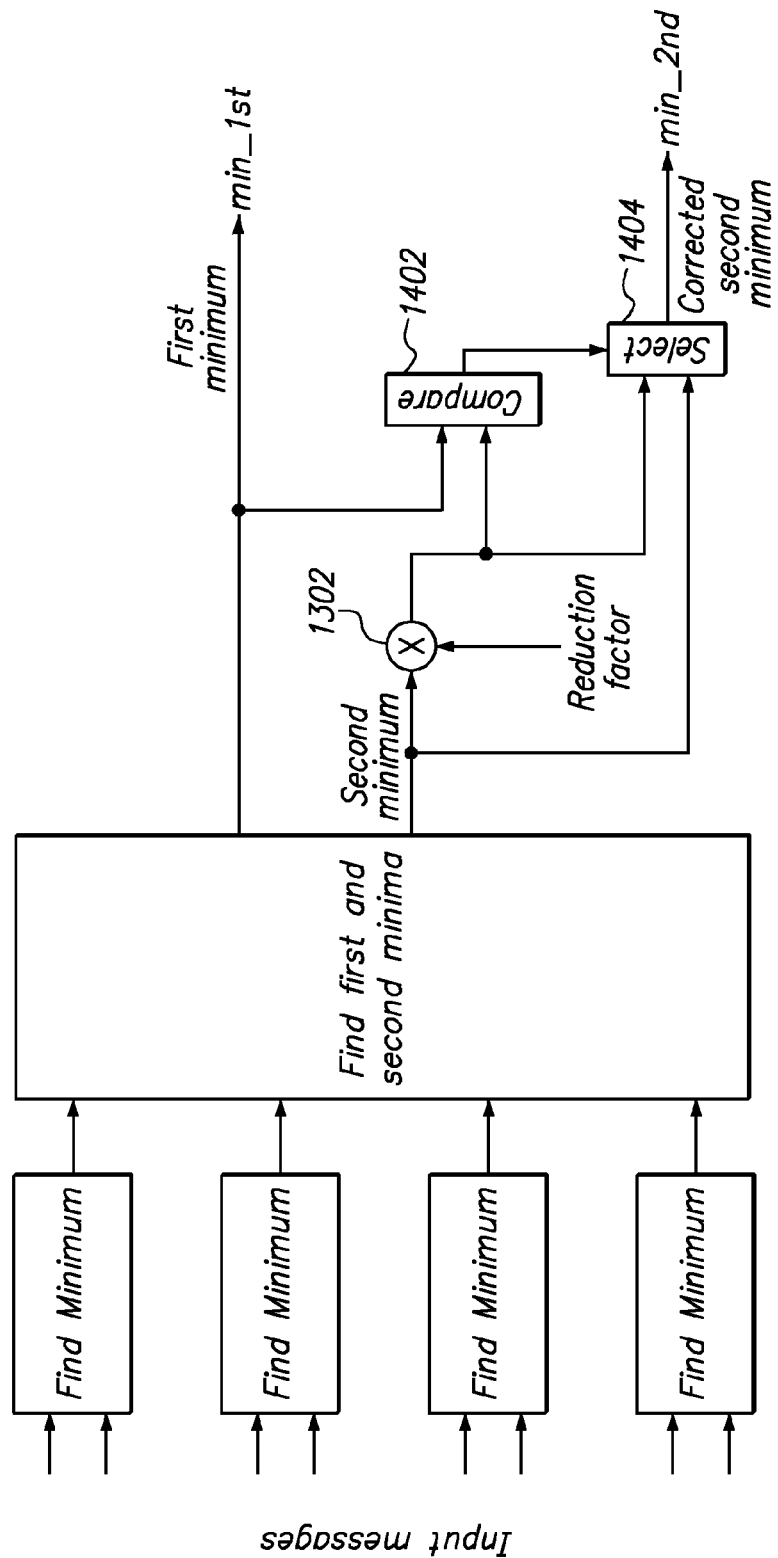
FIG. 14 illustrates an apparatus for identifying two selected values from among a plurality of values, where additional circuitry ensures that the resulting second minimum value is always greater than the first minimum value, in accordance with an embodiment of the present invention.

Functional elements shown in FIGS. 13 and 14 are given like reference numerals with corresponding elements of FIG. 4. In FIGS. 13 and 14, a multiplier 1302 performs the multiplication by the reduction factor to generate the corrected value. Compare block 1402 and select block 1404 compare the two values and select the lower one of the two as min_2nd.

The min-sum algorithm and its variants are approximations of the log-Sum-Product algorithm (LogSP) that allow simpler implementations. These algorithms have application in equalization and other areas, in addition to LDPC decoding. As such, embodiments of the present invention are not limited to LDPC decoding.

The foregoing detailed description of the present invention is provided for the purposes of illustration and is not intended to be exhaustive or to limit the invention to the embodiments disclosed. Accordingly, the scope of the present invention is defined by the appended claims.

What is claimed is:
1. A method of identifying two selected values from among a plurality of values, comprising steps of:
   partitioning the plurality of values into pairs of values;
   for each pair of values, using a hardware comparator device within an error correction decoder system to select one of the two values to form a vector of values that includes the selected value of each pair, wherein the vector of values does not necessarily include a second most extreme value of the plurality of values; and applying the vector to inputs of a hardware selection circuitry that identifies first and second extreme values from among the values of the vector.

2. The method according to claim 1 wherein said using a hardware comparator device to select one of the two values selects the lowest of the two values and wherein the first and second extreme values are the first and second lowest values from among the values of the vector.

3. The method according to claim 2, further comprising receiving a codeword from a communication channel wherein the codeword is encoded in accordance with an error correction code and wherein said steps of partitioning, using, forming and applying are performed to during a process of decoding the codeword.

4. The method according to claim 3, wherein the process of decoding the codeword comprises performing sum-product message passing among computing nodes of a decoder apparatus.

5. The method according to claim 4, wherein the plurality of values comprise log-likelihood ratios (LLRs).

6. The method according to claim 4, wherein the error correction code is a low density parity check (LDPC) code.

7. The method according to claim 4, further comprising comparing the corrected second extreme value to the first extreme value to ensure that the corrected extreme value is not more extreme than the first extreme value.

8. The method according to claim 1, further comprising applying a correction factor to the second of the extreme values to generate a corrected second extreme value.

9. A method of identifying two selected values from among a plurality of values, comprising steps of:
   partitioning a plurality of values into pairs of values;
   for each pair of values, using a hardware comparator device within an error correction decoder system to select one of the two values, wherein the selected values do not necessarily include a second most extreme value of the plurality of values;
   forming a next set of values from the selected value of each pair;
   repeating said step of partitioning, using and forming one or more times to form a vector of values that includes a selected value for each pair; and
   applying the vector to inputs of a hardware selection circuitry that identifies first and second extreme values from among the values of the vector.

10. The method according to claim 9, wherein said using a hardware comparator device to select one of the two values selects the lowest of the two values.

11. An apparatus for identifying two selected values from among a plurality of values, comprising:
    a plurality of comparison circuits, each comparison circuit being configured to receive a pair of values partitioned from the plurality of values and to select one of each pair of values as an output; and
    selection circuitry configured to receive the selected values output from the plurality of comparison circuits and to identify a first minimum value, the first minimum value being selected from among all of the values of the plurality and a second minimum value, the second minimum value being selected from among a subset of the values of the plurality wherein the subset of values of the plurality is does not necessarily include an absolute next minimum value from among all of the values of the plurality of values and wherein the selection circuitry is configured to output the first minimum value and the second minimum value.

12. The apparatus according to claim 11, wherein each of the plurality of comparison circuits comprises a comparator and a multiplexer.

13. The apparatus according to claim 12, wherein the apparatus for identifying two selected values is employed in an error correction decoder apparatus.

14. The apparatus according to claim 13, wherein the error correction decoder apparatus performs sum-product message passing among computing nodes of the error correction decoder apparatus.

15. The method according to claim 14, wherein the plurality of values comprise log-likelihood ratios (LLRs).

16. The apparatus according to claim 14, wherein the error correction decoder apparatus is configured to decode a low density parity check (LDPC) codewords.

* * * * *